United States Patent
Shimizu et al.

(10) Patent No.: US 6,362,044 B1
(45) Date of Patent: Mar. 26, 2002

(54) METHOD OF FORMING ON A SEMICONDUCTOR SUBSTRATE A CAPACITOR ELECTRODE HAVING HEMISPHERICAL GRAINS

(75) Inventors: Akira Shimizu; Yukihiro Mori; Satoshi Takahashi, all of Tama (JP)

(73) Assignee: ASM Japan K. K., Tokyo (JP)

( * ) Notice: Subject to any disclaimer, the term of this patent is extended or adjusted under 35 U.S.C. 154(b) by 0 days.

(21) Appl. No.: 09/665,134

(22) Filed: Sep. 19, 2000

(30) Foreign Application Priority Data

Sep. 22, 1999 (JP) .......... 11-269358

(51) Int. Cl.$^7$ .......... H01L 21/8242
(52) U.S. Cl. .......... 438/255; 438/398; 438/665
(58) Field of Search .......... 438/239, 250, 438/255, 398, 665

(56) References Cited

U.S. PATENT DOCUMENTS

| | | | | |
|---|---|---|---|---|
| 5,650,351 A | * | 7/1997 | Wu .......... | 437/52 |
| 5,723,384 A | * | 3/1998 | Park et al. .......... | 438/756 |
| 5,837,580 A | * | 11/1998 | Thakur et al. .......... | 438/255 |
| 5,926,711 A | * | 7/1999 | Woo et al. .......... | 438/260 |
| 6,027,970 A | * | 2/2000 | Sharan et al. .......... | 438/255 |
| 6,066,529 A | * | 5/2000 | Lin et al. .......... | 438/255 |
| 6,127,221 A | * | 10/2000 | Lin et al. .......... | 438/255 |
| 6,143,619 A | * | 11/2000 | Okamura et al. .......... | 438/398 |
| 6,159,849 A | * | 12/2000 | Kang et al. .......... | 438/665 |
| 6,165,840 A | * | 12/2000 | Choi et al. .......... | 438/253 |
| 6,165,841 A | * | 12/2000 | Kim et al. .......... | 438/255 |
| 6,211,077 B1 | * | 4/2001 | Shimizu et al. .......... | 438/665 |

OTHER PUBLICATIONS

Yamamoto et al. "Low temperature metal/ON/HSG–cylinder capacitor process for high density embedded DRAMs" IEEE VLSI Technology, 1999 Digest of Technical papers Jun. 14–16, 1999, pp. 157–158.*

Wolf et al. Silicon Processing for the VLSI Era vol. I: Process Technology Lattice Press 1986 pp. 532–534.*

R.P.S. Thakur, et al., Process simplification in DRAM Manufacturing, IEEE Transactions N Electron Devices. vol. 45 No. 3, Mar. 1998, pp 609–619.

* cited by examiner

*Primary Examiner*—Wael Fahmy
*Assistant Examiner*—Fernando Toledo
(74) *Attorney, Agent, or Firm*—Knobbe, Martens, Olson & Bear, LLP

(57) ABSTRACT

An improved capacitor electrode made of polysilicon having a rough surface on a semiconductor substrate is formed by (a) removing a spontaneous oxidation film adhering to an amorphous silicon surface; (b) heating the amorphous silicon to a designated temperature; (c) spraying $SiH_4$ at a designated temperature on the amorphous silicon to form an amorphous silicon/polysilicon mixed-phase active layer on the surface; (d) annealing at a designated temperature to form an HSG so as to roughen the amorphous silicon surface; (e) $PH_3$-annealing the HSG-forming polysilicon, wherein $PH_3$ is introduced at a designated concentration at the start of heating to a designated temperature; and (f) nitriding the amorphous silicon surface at the stated temperature by continuously introducing $NH_3$ gas instead of $PH_3$.

12 Claims, 6 Drawing Sheets

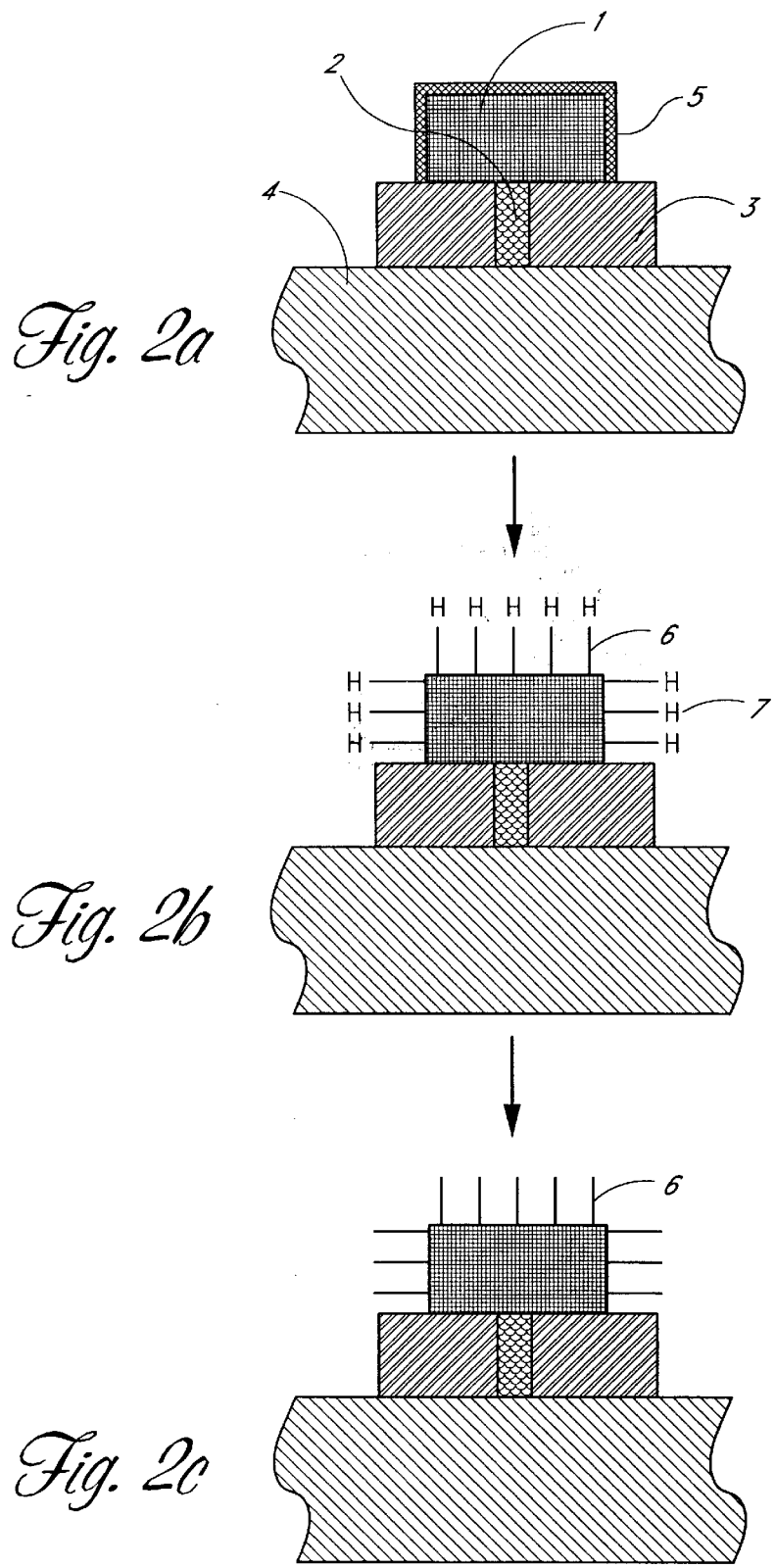

SIMS Measurement Sample Structure

METHOD OF FORMING ON A SEMICONDUCTOR SUBSTRATE A CAPACITOR ELECTRODE HAVING HEMISPHERICAL GRAINS

BACKGROUND OF THE INVENTION

1. Field of the Invention

The present invention relates to a manufacturing method of a semiconductor device and particularly relates to a manufacturing method of a capacitor electrode with an HSG-processed surface.

2. Description of the Related Art

As semiconductor devices recently become more highly integrated, reducing a cell area is desired. In the case of DRAM in which one bit comprises one transistor and one capacitor, however, if a cell area diminishes, a capacitor electrode area diminishes, data storage time lowers, and it becomes difficult to secure the minimum capacity required for preventing memory loss caused by an alpha ray, etc. To reduce a cell area and at the same time to increase a capacitor electrode area, attempts to create a three-dimensional structure including a cylinder structure shown in FIG. 1(a) and a fin structure shown in FIG. 1(b) were made. A method of coating an amorphous silicon surface by tantalumoxide ($Ta_2O_5$) with a high dielectric constant, as shown in FIG. 1(c), or by bariumtitanic acid strontium ($Ba_{(x)}Sr_{(1-x)}TiO$) with a high dielectric constant, as shown in FIG. 1(d), have been considered, but this method has not been made practicable yet.

Accordingly, an HSG process (hemispherical grained process) (shown in FIG. 1(e)) which increases a surface area by roughening Si on a capacitor electrode surface attracts attention. The HSG process is a method of causing the electrode surface to migrate unevenly by removing a spontaneous oxidation film from the amorphous silicon surface by preprocessing, removing hydrogen from dangling bonds by heating a semiconductor wafer to a processing temperature, forming a selectively active amorphous silicon/polysilicon mixed-phase layer only on the active surface of the amorphous polysilicon, and crystallizing the surface.

If this HSG process is used, however, a problem occurs in that a phosphorus concentration in HSG grain drops occurs, because phosphorus (P) which is doped is more difficult to move than Si when the foundation amorphous silicon migrates. If a C-V measurement is taken at this state, capacitance rating drops on the volume side (depleted), and a Cmin/Cmax ratio worsens to approximately 0.85~0.40 times the ratio before the HSG formation. With this result, the effects of a surface area increase are lessened.

To solve this problem, conventionally after the HSG formation, it was necessary to supplement P which was deficient by removing a semiconductor wafer from a device and doping $PH_3$ using a separate apparatus. Additionally, as a subsequent process, there was a process of forming a capacity film using SiN. This process, however, also required nitriding treatment in another apparatus and removing a semiconductor wafer from the HSG-forming apparatus.

It is necessary to rinse the semiconductor wafer every time it contacts the atmosphere, hence there were problems that not only the number of processes increased but also a surface area decreased because HSG grain was etched by re-rinsing.

Furthermore, a conventional nitriding temperature is approximately 850° C. (1562° F.). There is a problem of impurity rediffusion as semiconductor devices become more highly integrated and lowering of a nitriding temperature is necessary.

Consequently, an object of the present invention is to increase capacitance effectively by continuously $PH_3$-annealing a semiconductor wafer without removing it from the apparatus, and further, to provide a method of manufacturing a semiconductor device which excels in stability and reproducibility by performing nitriding at a low temperature.

Additionally, another object of the present invention is to provide a method of manufacturing a semiconductor device which improves productivity by continuously performing $PH_3$-annealing and nitriding without increasing the number of processes.

SUMMARY OF THE INVENTION

To solve the above-mentioned problems, the present invention includes, but is not limited to, the following embodiments:

A method of forming a capacitor electrode comprising polysilicon having a rough surface on a semiconductor substrate, comprises (a) a preprocess of removing a spontaneous oxidation film adhering to an amorphous silicon surface, (b) a process of heating the amorphous silicon to a designated temperature, a process of spraying $SiH_4$ at a designated temperature on the amorphous silicon to form an amorphous/polysilicon mixed-phase active layer on the surface, (c) a process of annealing at a designated temperature to form a HSG so as to roughen the amorphous silicon surface, (d) a process of $PH_3$-annealing the HSG-forming polysilicon, wherein $PH_3$ is introduced at a designated concentration at the start of heating to a designated temperature, and (e) a process of nitriding the amorphous silicon surface at a designated temperature by continuously introducing $NH_3$ gas instead of $PH_3$.

Specifically, in an embodiment, the preprocessing may comprise processes of immersion in diluted HF, rinsing with pure water, and drying.

Preferably, a temperature to which the amorphous silicon is heated is 500° C.~600° C. (932° F.~1112° F.).

Further, preferably, a $SiH_4$ concentration is 30%~50% in an embodiment. Specifically, in an embodiment, the annealing temperature is 500° C.~600° C. (932° F.~1112° F.).

Additionally, in the process of $PH_3$-annealing the amorphous silicon, $PH_3$ may be diluted to 0.5%~5.0%, for example, by inert gases such as nitrogen, argon, and helium, or hydrogen.

Additionally, in another embodiment, during the nitriding process, a mixed gas of $NH_3$ and hydrazine or monomethylehydrazine may be used.

Preferably, the designated temperature for the $PH_3$ annealing and nitriding is 560° C.~750° C. (1040° F.~1382° F.).

According to an embodiment of the present invention, a capacitor electrode with a larger surface area can be achieved with fewer processes than could be achieved using the conventional method.

Additionally, according to an embodiment of the present invention, a stable capacitor electrode with a controlled progress of migration can be obtained.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of the present invention will become apparent from the detailed description of the preferred embodiments which follow.

BRIEF DESCRIPTION OF THE DRAWINGS

These and other features of the present invention will now be described with reference to the drawings of preferred embodiments which are intended to illustrate and not to limit the invention.

FIGS. 2(a) through 2(c) are sketches of the preprocessing and annealing processes of a capacitor electrode according to an embodiment of the present invention.

DETAILED DESCRIPTION OF THE PREFERRED EMBODIMENT

Figure 1A:
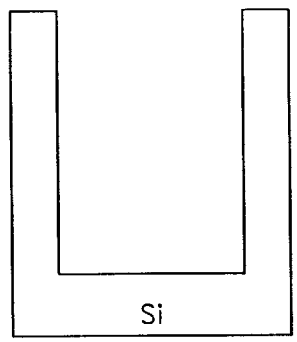
FIGS. 1(a) through 1(f) show conventional or experimental technologies used for a capacitor electrode.
Figure 1B:
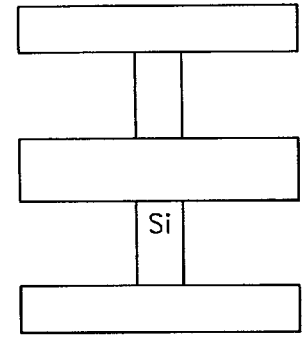
Figure 1C:
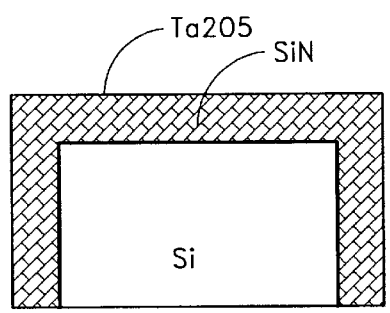
Figure 1D:
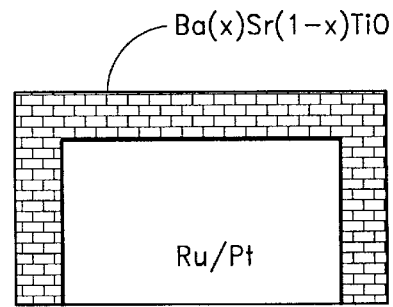
Figure 1E:
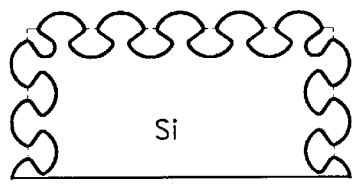

The present invention is explained in detail referring to the figures in the following, but the present invention is not limited thereto:

A method of forming a capacitor electrode comprising polysilicon with a rough surface on a semiconductor substrate according to the present invention comprises a preprocess of removing a spontaneous oxidation film adhering to an amorphous silicon surface, a process of heating the amorphous silicon to a designated temperature, a process of spraying $SiH_4$ at a designated temperature on the amorphous silicon to form an amorphous silicon/polysilicon mixed-phase active layer on the surface, a process of annealing at a designated temperature to form a HSG so as to roughen the amorphous silicon surface, a process of $PH_3$-annealing the HSG-forming polysilicon, wherein $PH_3$ is introduced at a designated concentration at the start of heating to a designated temperate, and a process of nitriding the amorphous silicon surface at a designated temperature by continuously introducing $NH_3$ gas instead of $PH_3$.

FIGS. 2(a) through 2(g) are illustrations of the processes of the method according to the present invention.

Amorphous silicon 1 is on an oxidation film (SiO2) 3 and is electrically conductive with a substrate 4 via polysilicon 2. On the surface of the amorphous silicon 1, a spontaneous oxidation film 5 adheres (FIG. 2(a)). The oxidation film 5 can be removed by HF at a designated concentration. Subsequent rinsing with pure water and drying forms dangling bonds 6 on the surface of an amorphous silicon 1 and these dangling bonds are terminated with hydrogen 7 (FIG. 2(b)). Maintaining this state, a semiconductor wafer is loaded into a cassette module (not shown), the cassette module is evacuated using a dry pump (not shown) and a pressure is controlled at 1 Torr by introducing nitrogen.

Through a transfer module (not shown) which is controlled similarly at 1 Torr, semiconductor wafers are transferred from the cassette module to a boat elevator chamber (not shown) at the lower part of a surface reaction thin-film formation device (not shown) singly. After all semiconductor wafers are transferred, the transfer module and the boat elevator chamber are detached by a gate valve (not shown). A boat (now shown) carrying multiple semiconductor wafers is loaded into the surface reaction thin-film device and the device is evacuated using a turbo molecular pump (not shown).

Within the surface reaction thin-film device, a semiconductor wafer is heated to 500° C.~600° C. (932° F.~1112° F.) and, as shown in FIG. 2(c), hydrogen is removed from the dangling bonds.

Figures 2D, 2E:
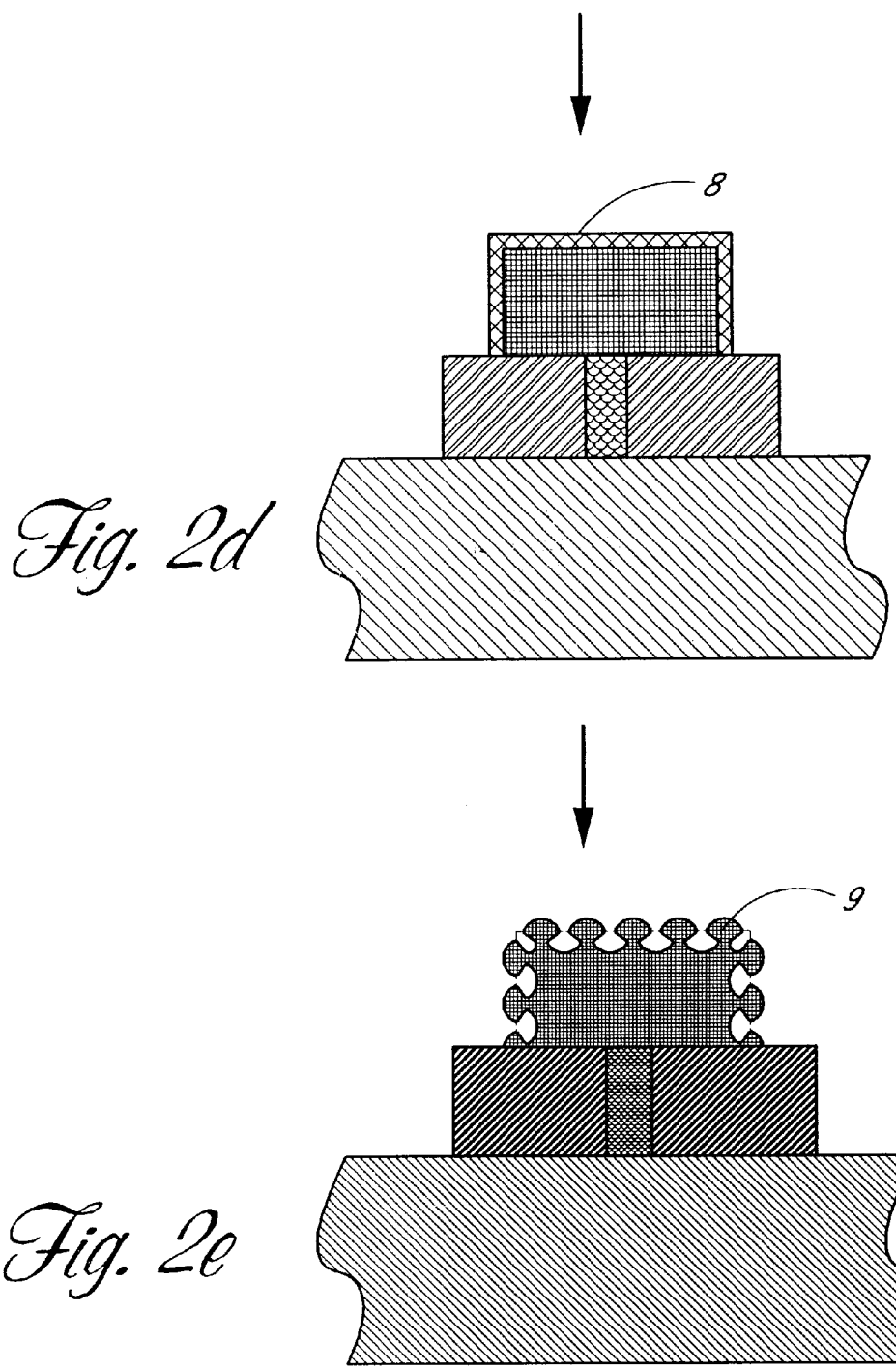
FIGS. 2(d) and 2(e) are sketches of the progress of the HSG process according to an embodiment of the present invention.
Figure 2F:
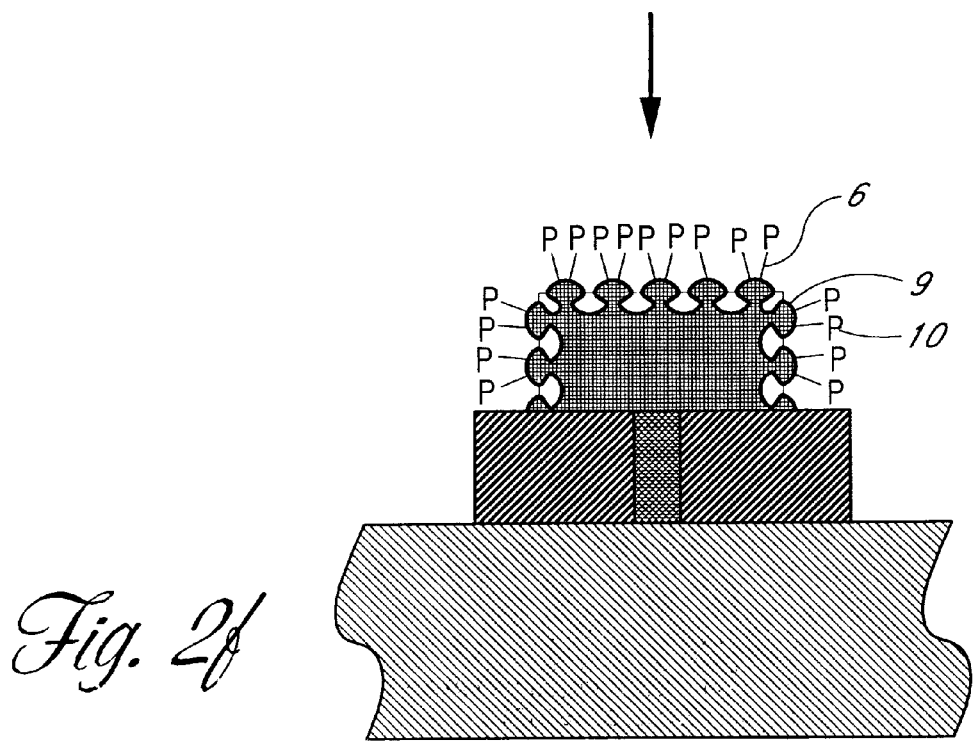
FIGS. 2(f) and 2(g) are sketches of the $PH_3$-annealing and the nitriding processes according to an embodiment of the present invention.
Figure 2G:
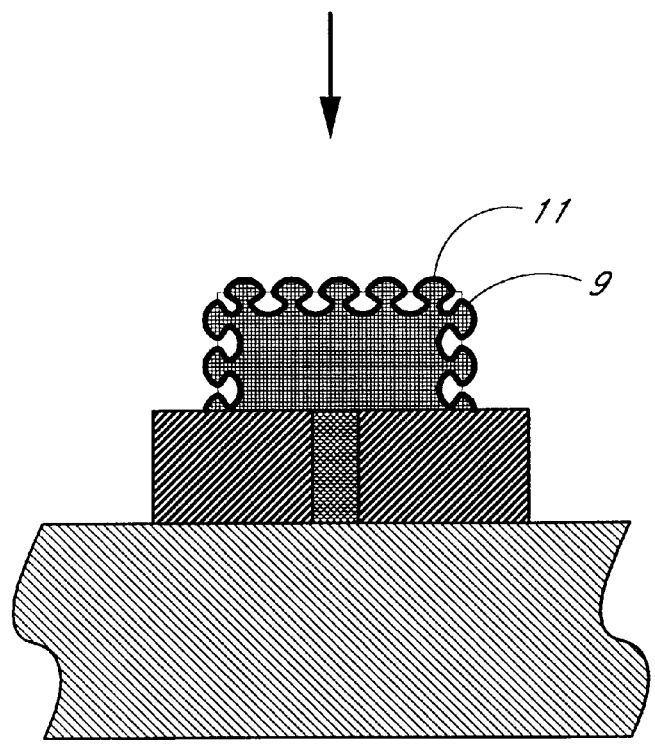

After heating is completed, by introducing $SiH_4$ at a concentration of preferably 30%~50%, an active amorphous silicon/polysilicon mixed-phase thin-film 8 is formed on the surface of the amorphous silicon 1 (FIG. 2(d)).

By continuously annealing at a designated temperature of 500° C.~600° C. (932° F.~1112° F.) for a designated time, HSG 9 having a rough surface is formed on the surface of the amorphous silicon 1 (FIG. 2(e)). By controlling the mixed-phase growth film thickness of amorphous silicon/polysilicon, an HSG density can be controlled, and by adjusting the annealing time, a grain size of any HSG density can be controlled.

After the HSG is formed, the boat is unloaded and semiconductor wafers are transferred singly to the boat elevator chamber at the lower part of a $PH_3$ reactor via the transfer module controlled at 1 Torr. After all semiconductor wafers are transferred, the transfer module and the boat elevator chamber are detached by the gate valve. The boat carrying multiple semiconductor wafers is loaded into the $PH_3$ reactor.

Problems at this point are that HSG migration has progressed within the $PH_3$ reactor and that because the degree of the migration is inconsistent at the upper part and at the lower part, grain sizes are inconsistent among semiconductor wafers.

To prevent these problems, inventors of the present invention discovered that by supplying $PH_3$ inside the reactor before the start of $PH_3$ annealing, i.e., from the time when a semiconductor wafer is heated at a processing temperature, migration after HSG formation could be controlled and nonuniformity of the grain size within the boat could be controlled.

Consequently, $PH_3$ gas is introduced simultaneously when the boat is loaded (a flow rate of 10 sccm to 1,000 sccm) during a pre-heat period. When the temperature reaches a designated processing temperature, $PH_3$ gas is continuously introduced at a constant flow rate or at a different flow rate (10 sccm to 1,000 sccm). As $PH_3$ gas, $PH_3$ gas which is diluted by an inert gas such as nitrogen, argon, and helium or hydrogen preferably to 0.5% to 5.0% (further preferably 1% to 2%) is used. After $PH_3$-annealing is performed at a designated temperature (e.g., 560° C. to 750° C., preferably 600° C. to 700° C.) and for a designated time (e.g., 30 minutes to 120 minutes), dangling bonds 6 are terminated with phosphorus 10 (FIG. 2(f)).

Figure 3:
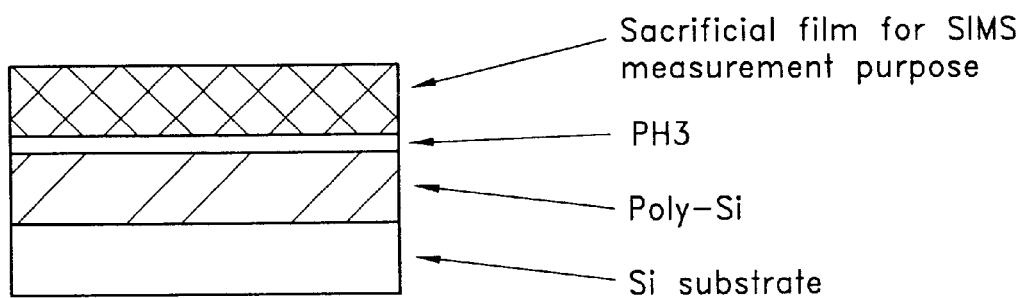
FIG. 3 shows the SIMS measurement sample structure.
Figure 4:
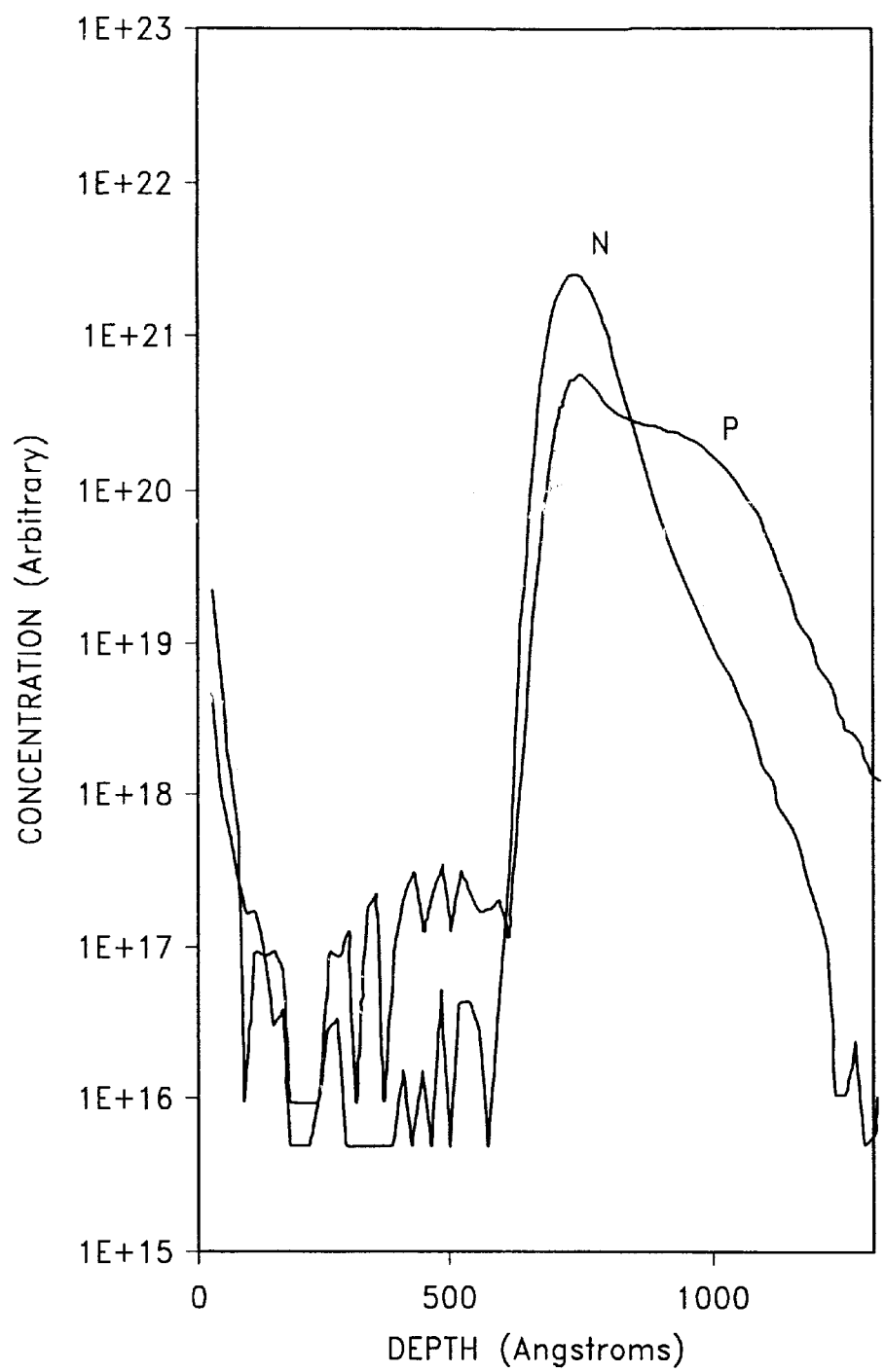
FIG. 4 shows the concentration profile of P and N upon the $PH_3$-annealing and the nitriding processes according to an embodiment of the present invention.

Lastly, $PH_3$ gas is shut off, $NH_3$ gas or $NH_3$ mixed gas of $NH_3$ and at least one of hydrazine or monomethylhydrazine (0.1% to 5% $NH_3$) is introduced and an HSG surface is continuously nitrided. A nitride film SiN 11 is formed on the surface of HSG 9 of the amorphous silicon 1 (FIG. 2(g)). The inventors of the present invention discovered that nitriding which conventionally was performed at approximately 850° C. (1562° F.) could also be performed on an active HSG surface after $PH_3$-annealing at the same low temperature (560° C. to 750° C. (1040° F.~1382° F.)) as that of $PH_3$ annealing (FIGS. 3 and 4). That is, the nitriding treatment can be conducted at a temperature of 560° C. to 750° C., for example, preferably 600° C. to 700° C. The nitriding temperature can be selected in the range independently of the $PH_3$-annealing temperature or can be the substantially same as the $PH_3$-annealing temperature. $NH_3$ gas or $NH_3$ mixed gas may be introduced at a flow rate of 10 sccm to 1,000 sccm.

EXAMPLES

Figure 1F:
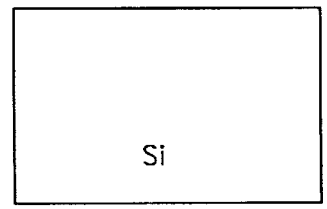

Under the following experiment conditions, a change in the capacity increase rate was examined, wherein $PH_3$ gas was diluted by 0.5 to 5%:
 a) Comparative Example 1 (a thick-film stack of silicon (FIG. 1(f))
(1) Capacity Film and Upper Electrode Formation
 b) Comparative Example 2 (In the case where a surface reaction thin-film formation device, a $PH_3$ reactor and a $NH_3$ reactor are independent of each other)
(1) Preprocessing:
 0.3% diluted HF, pure water rinsing and drying
(2) HSG Formation:
 Controlled at 1E-3Torr while introducing 100 sccm of He gas
 Heated for 20 minutes until a temperature reached 560° C. (1040° F.)
 40% $SiH_4$ was poured.
(3) Preprocessing:
 0.3% diluted HF, pure water rinsing and drying
(4) $PH_3$-annealing:
 Heated for 30 minutes until a temperature of a semiconductor wafer reached 650° C. (1202° F.) and subsequent $PH_3$ annealing was performed for one hour (a flow rate of $PH_3$ gas: 500 sccm)
(5) Preprocessing:
 0.3% diluted HF, pure water rinsing and drying
(6) Nitriding:
 Nitriding was performed for 40 minutes while introducing 500 sccm of $NH_3$ gas (at a temperature of 650° C.)
(7) Capacity Film and Upper Electrode Formation
 c) Comparative Example 3 (A separate device was used only for nitriding.)
1) Preprocessing:
 0.3% diluted HF, pure water rinsing and drying
2) HSG Formation: —Controlled at 1E-3 Torr while introducing 100 sccm of He gas —Heated for 20 minutes until a temperature reached 560° C. (1040° F.) —$SiH_4$ of 40% was poured.
3) $PH_3$-annealing:
 Heated for 30 minutes until a temperature of a semiconductor wafer reached 650° C. (1202° F.) and subsequent $PH_3$ annealing was performed for one hour (a flow rate of $PH_3$ gas: 500 sccm)
4) Preprocessing:
 0.3% diluted HF, pure water rinsing and drying
5) Nitriding:
 Nitriding was performed for 40 minutes while introducing 500 sccm $NH_3$ gas (at a temperature of 650° C.)
6) Capacity film and upper electrode formation d) Comparative Example 4 ($PH_3$ was not introduced while heating in a $PH_3$-annealing reactor.)
1) Preprocessing:
 0.3% diluted HF, pure water rinsing and drying
2) HSG formation:
 Controlled at 1E-3 Torr while introducing 100 sccm of He gas
 Heated for 20 minutes to 560° C. (1040° F.)
 40% $SiH_4$ was poured.
3) $PH_3$-annealing:
 Heated for 30 minutes until a temperature of a semiconductor wafer reached 650° C. (1202° F.) and subsequent $PH_3$-annealing was performed for one hour (a flow rate of $PH_3$ gas: 500 sccm)
4) Nitriding:
 Nitriding was performed for 40 minutes while introducing 500 sccm of $NH_3$ gas (at a temperature of 650° C.)
5) Capacity Film and Upper Electrode Formation
 e) Example according to the present invention ($PH_3$ was introduced while heating in the $PH_3$-anneal reactor.)
1) Preprocessing:
 0.3% diluted HF, pure water rinsing and drying
2) HSG Formation:
 Controlled at 1E-3 Torr while introducing 100 sccm of He gas
 Heated for 20 minutes until a temperature reached 560° C. (1040° F.)
 40% $SiH_4$ was poured.
3) $PH_3$-annealing:
 Immediately after loading was completed, heat was performed until a temperature of a semiconductor wafer reached 650° C. (1202° F.) for 30 minutes and subsequent $PH_3$-annealing was performed for one hour (a flow rate of $PH_3$ gas: 500 sccm)
4) Nitriding:
 $PH_3$ was switched to $NH_3$ and while introducing 500 sccm of $NH_3$ gas, nitriding was performed for 40 minutes (at a temperature of 650° C.).
5) Capacity Film and Upper Electrode Formation
 Experiment results shown in the following table were obtained:

TABLE 1

| Condition | Boat Position | Capacity Increase Rate | | | Comments |
| --- | --- | --- | --- | --- | --- |
| | | −1.4 V | 0 V | +1.4 V | |
| a (thick-film stack) | Center | 1 | 1 | 1 | Initial values |
| b (+ HSG) | Center | 1.8 | 2.4 | 2.4 | |
| c (+ HSG + $PH_3$) | Center | 2.1 | 2.1 | 2.1 | Nitriding was performed in separate apparatus. |
| d (+ HSG + $PH_3$ + SiN) | Top | 1.2 | 1.2 | 1.2 | During pre-heat period in $PH_3$ annealing reactor, $PH_3$ was not introduced |
| | Center | 1.5 | 1.5 | 1.5 | |
| | Bottom | 1.9 | 1.9 | 1.9 | |
| e (+ HSG + $PH_3$ + SiN) | Top | 2.5 | 2.5 | 2.5 | During pre-heat period in $PH_3$ annealing reactor, $PH_3$ was introduced (the present invention) |
| | Center | 2.5 | 2.5 | 2.5 | |
| | Bottom | 2.5 | 2.5 | 2.5 | |

When comparing Comparative Example 1 and the Example according to the present invention, it is understood that in the Example (a deficiency in P was compensated for by the HSG process), an approximately 2.5 times larger surface area than in Comparative Example 1 (the HSG process was not performed) was obtained.

When comparing Comparative Example 1 and Comparative Example 2, it is understood that in Comparative Example 2 (the HSG process was performed but $PH_3$-annealing was not performed), due to depletion of P, an only 1.8 times larger capacity increase on the negative voltage side than in Comparative Example 1 was obtained.

When comparing Comparative Example 1 and Comparative Example 3, in Comparative Example 3 (nitriding treatment was solely performed in a separate apparatus), an only approximately 2.1 times larger surface area than in Comparative Example 1 was obtained.

When comparing Comparative Example 4 and the Example according to the present invention, it is understood that in the Example according to the present invention ($PH_3$ was introduced while heating in the $PH_3$ annealing reactor), a progress of HSG migration was controlled more than in Comparative Example 4, thereby increasing a surface area.

When comparing Comparative Example 4 and the Example according to the present invention, it understood that in Comparative Example 4, the capacity increase rate changed depending on the position in the boat, whereas in the Example according to the present invention, the capacity increase rate was constant regardless of the position in the boat.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of forming on a semiconductor substrate a capacitor electrode comprising polysilicon having a rough surface, said method comprising:

removing a spontaneous oxidation film adhering to an amorphous silicon surface of a semiconductor substrate, heating said amorphous silicon to a designated temperature, spraying $SiH_4$ at a designated temperature on said amorphous silicon to form an amorphous silicon/polysilicon mixed-phase active layer on the surface, annealing at a designated temperature to form a HSG so as to roughen said amorphous silicon surface, $PH_3$-annealing the HSG-forming polysilicon at a designated temperature, wherein introduction of $PH_3$ at a designated concentration is started at the start of heating to the designated temperature upon loading a plurality of the HSG-formed substrates into a reactor for $PH_3$ annealing, and nitriding said amorphous silicon surface at a designated temperature by continuously introducing $NH_3$ gas instead of $PH_3$.

2. The method as claimed in claim 1, wherein said preprocessing comprises processes of immersion in diluted HF, rinsing with pure water, and drying.

3. The method as claimed in claim 1, wherein said temperature to which said amorphous silicon is heated is 500° C.–600° C.

4. The method as claimed in claim 1, wherein said sprayed gas contains $SiH_4$ at a concentration of 30%–50%.

5. The method as claimed in claim 1, wherein said annealing temperature is 500° C.–600° C.

6. The method as claimed in claim 1, wherein in the process of $PH_3$-annealing said amorphous silicon, $PH_3$ is diluted to 0.5%–5.0% by an inert gas such as nitrogen, argon, and helium, or hydrogen.

7. The method as claimed in claim 1, wherein in said nitriding process, a mixed gas of $NH_3$ and hydrazine or monomethylehydrazine is used.

8. The method as claimed in claim 1, wherein the designated temperature for said $PH_3$ annealing and nitriding is 560° C.–750° C.

9. A method of forming on a semiconductor substrate a capacitor electrode comprising polysilicon, having a rough surface, said method comprising the steps of:

forming an HSG on a semiconductor substrate;

loading a plurality of the HSG-formed substrates into a reactor for $PH_3$ annealing;

starting supplying a gas containing 0.5%–5.0% $PH_3$ into the reactor upon the completion of the loading prior to the start of $PH_3$ annealing;

$PH_3$-annealing the HSG at a designated temperature in the reactor to end-couple its active surface with phosphorus;

continuously introducing into the reactor an $NH_3$-containing gas instead of the $PH_3$-containing gas used in the $PH_3$-annealing; and nitriding the surface of the HSG with the $NH_3$-containing gas at a designated temperature, thereby forming a capacitor electrode on each semiconductor substrate.

10. The method as claimed in claim 9, wherein prior to the $PH_3$-annealing, the semiconductor substrate is transferred to the reactor without being exposed to the ambient atmosphere.

11. The method as claimed in claim 9, wherein the designated temperature for the nitriding is the same as the $PH_3$-annealing temperature.

12. The method as claimed in claim 9, wherein the designated temperature for the nitriding and the $PH_3$-annealing temperature are 560° C.–750° C.

* * * * *